United States Patent
Sakamoto

(10) Patent No.: US 8,564,561 B2
(45) Date of Patent: Oct. 22, 2013

(54) METHOD OF DETECTING CONTACT STATE OF RESISTIVE TOUCH PANEL DEVICE, TOUCH PANEL DEVICE, AND DISPLAY DEVICE

(75) Inventor: Masanori Sakamoto, Hamura (JP)

(73) Assignee: Casio Computer Co., Ltd., Tokyo (JP)

( * ) Notice: Subject to any disclaimer, the term of this patent is extended or adjusted under 35 U.S.C. 154(b) by 444 days.

(21) Appl. No.: 13/029,247

(22) Filed: Feb. 17, 2011

(65) Prior Publication Data

US 2011/0216034 A1    Sep. 8, 2011

(30) Foreign Application Priority Data

Mar. 3, 2010   (JP) ................................. 2010-046906
Dec. 21, 2010  (JP) ................................. 2010-284213

(51) Int. Cl.
*G06F 3/045*   (2006.01)
(52) U.S. Cl.
USPC ......... 345/173; 345/174; 324/713; 178/18.05
(58) Field of Classification Search
USPC ................... 345/173–184; 178/18.01–20.01; 324/713; 341/5–20
See application file for complete search history.

(56) References Cited

U.S. PATENT DOCUMENTS

| | | | | |
|---|---|---|---|---|
| 4,929,934 A | * | 5/1990 | Ueda et al. ..................... | 345/174 |
| 6,163,313 A | * | 12/2000 | Aroyan et al. ................ | 345/173 |
| 6,646,634 B2 | * | 11/2003 | Berelovich et al. .......... | 345/174 |
| 7,825,906 B2 | | 11/2010 | Nakajima et al. | |
| 8,432,373 B2 | * | 4/2013 | Huang et al. .................. | 345/174 |
| 2008/0117178 A1 | * | 5/2008 | Ko et al. ....................... | 345/173 |
| 2009/0072670 A1 | * | 3/2009 | Hansson et al. .............. | 310/338 |
| 2009/0189877 A1 | | 7/2009 | Washino et al. | |
| 2010/0149122 A1 | * | 6/2010 | Lin ............................... | 345/173 |

FOREIGN PATENT DOCUMENTS

| JP | 80241161 A | 9/1996 |
|---|---|---|
| JP | 2007-025904 A | 2/2007 |
| JP | 2009-176114 A | 8/2009 |
| JP | 2009-176218 A | 8/2009 |
| KR | 10-2009-0082142 A1 | 7/2009 |

OTHER PUBLICATIONS

Korean Office Action dated May 30, 2012 (and English translation thereof) in counterpart Korean Application No. 10-2011-0018421.

* cited by examiner

*Primary Examiner* — Amare Mengistu
*Assistant Examiner* — Vinh Lam
(74) *Attorney, Agent, or Firm* — Holtz, Holtz, Goodman & Chick, PC

(57) ABSTRACT

A method of detecting a contact state includes measuring first, second, third and fourth potentials. The method further includes deriving distance information between two points when a first resistive film contacts a second resistive film at the two points, based on the first, second, third and fourth potentials. The first, second, third and fourth potentials are potentials at fourth, second, third and fourth end regions, respectively, in first, second, third and fourth states, respectively. A first end region is an end region, as viewed in a first direction, and the second end region is an end region opposite to the first end region of the first resistive film. The third end region is an end region, as viewed in a second direction, and the fourth end region is an end region opposite to the third end region of the second resistive film.

20 Claims, 14 Drawing Sheets

|    | X1  | X2  | X3  | X4  | X5  | X6  |
|----|-----|-----|-----|-----|-----|-----|
| Y1 | 0.4 | 1.2 | 2.1 | 2.9 | 3.7 | 4.6 |
| Y2 | 0.4 | 1.2 | 2.1 | 2.9 | 3.7 | 4.6 |
| Y3 | 0.4 | 1.2 | 2.1 | 2.9 | 3.7 | 4.6 |
| Y4 | 0.4 | 1.2 | 2.1 | 2.9 | 3.7 | 4.6 |
| Y5 | 0.4 | 1.2 | 2.1 | 2.9 | 3.7 | 4.6 |
| Y6 | 0.4 | 1.2 | 2.1 | 2.9 | 3.7 | 4.6 |
| Y7 | 0.4 | 1.2 | 2.1 | 2.9 | 3.7 | 4.6 |
| Y8 | 0.4 | 1.2 | 2.1 | 2.9 | 3.7 | 4.6 |

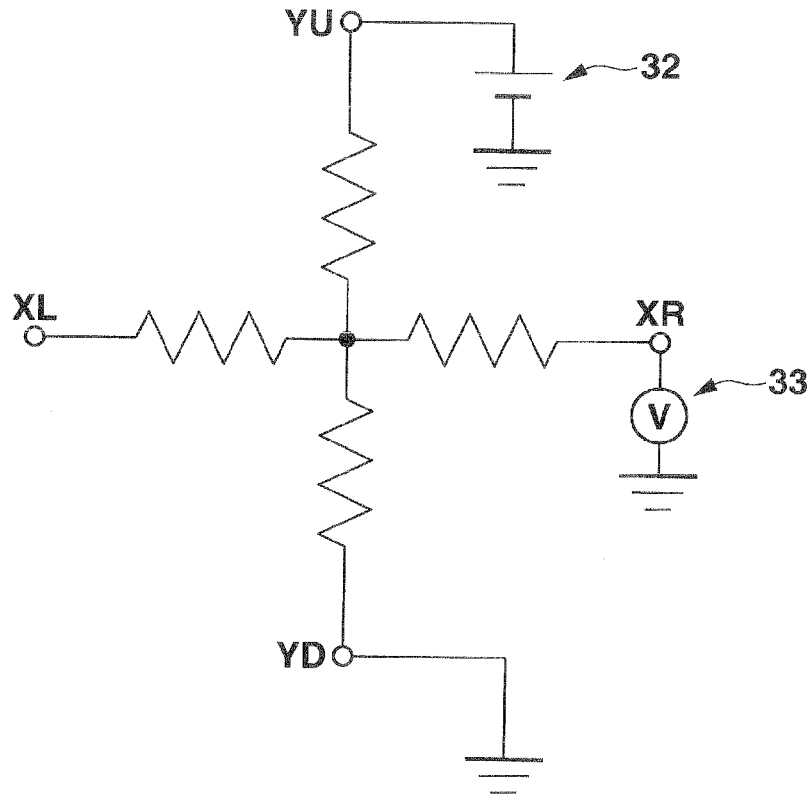

|    | X1  | X2  | X3  | X4  | X5  | X6  |
|----|-----|-----|-----|-----|-----|-----|
| Y1 | 0.0 | 0.1 | 0.1 | 0.2 | 0.2 | 0.3 |
| Y2 | 0.1 | 0.2 | 0.4 | 0.5 | 0.7 | 0.8 |
| Y3 | 0.1 | 0.3 | 0.6 | 0.8 | 1.0 | 1.2 |
| Y4 | 0.1 | 0.4 | 0.7 | 1.0 | 1.3 | 1.6 |
| Y5 | 0.2 | 0.5 | 0.9 | 1.2 | 1.5 | 1.8 |
| Y6 | 0.2 | 0.6 | 1.0 | 1.3 | 1.7 | 2.1 |
| Y7 | 0.2 | 0.6 | 1.0 | 1.4 | 1.9 | 2.3 |
| Y8 | 0.2 | 0.7 | 1.0 | 1.4 | 1.9 | 2.6 |

FIG.12

|    | X1 | X2  | X3  | X4  | X5  | X6  |
|----|----|-----|-----|-----|-----|-----|
| Y1 |    | 2.3 | 1.9 | 1.5 | 1.1 | 0.8 |
| Y2 |    | 2.1 | 1.8 | 1.5 | 1.3 | 1.0 |
| Y3 |    | 1.9 | 1.7 | 1.5 | 1.4 | 1.3 |
| Y4 |    | 1.6 | 1.5 |     | 1.5 | 1.6 |
| Y5 |    | 1.3 | 1.4 | 1.5 | 1.7 | 1.9 |
| Y6 |    | 1.0 | 1.3 | 1.5 | 1.8 | 2.1 |
| Y7 |    | 0.8 | 1.1 | 1.5 | 1.9 | 2.3 |
| Y8 |    |     |     |     |     |     |

FIG.13

|    | X1 | X2 | X3 | X4 | X5 | X6 |
|----|----|----|----|----|----|----|
| Y1 |    | ○  | ○  | ○  | ×  | ×  |
| Y2 |    | ○  | ○  | ○  | ×  | ×  |
| Y3 |    | ○  | ○  | ○  | ×  | ×  |
| Y4 |    | ○  | ○  |    | ○  | ○  |
| Y5 |    | ×  | ×  | ○  | ○  | ○  |
| Y6 |    | ×  | ×  | ○  | ○  | ○  |
| Y7 |    | ×  | ×  | ○  | ○  | ○  |
| Y8 |    |    |    |    |    |    |

|    | X1  | X2  | X3  | X4  | X5  | X6  |
|----|-----|-----|-----|-----|-----|-----|
| Y1 | 0.2 | 0.6 | 1.0 | 1.4 | 1.9 | 2.6 |
| Y2 | 0.2 | 0.6 | 1.0 | 1.4 | 1.9 | 2.3 |
| Y3 | 0.2 | 0.6 | 1.0 | 1.3 | 1.7 | 2.1 |
| Y4 | 0.2 | 0.5 | 0.9 | 1.2 | 1.5 | 1.9 |
| Y5 | 0.1 | 0.4 | 0.7 | 1.0 | 1.3 | 1.6 |
| Y6 | 0.1 | 0.4 | 0.6 | 0.8 | 1.1 | 1.3 |
| Y7 | 0.1 | 0.2 | 0.4 | 0.5 | 0.7 | 0.9 |
| Y8 | 0.0 | 0.1 | 0.1 | 0.2 | 0.3 | 0.4 |

FIG.16

|  | X1 | X2 | X3 | X4 | X5 | X6 |
|---|---|---|---|---|---|---|
| Y1 |  | 1.1 | 1.4 | 1.7 | 2.1 | 2.5 |
| Y2 |  | 1.3 | 1.5 | 1.7 | 2.0 | 2.2 |
| Y3 |  | 1.5 | 1.6 | 1.7 | 1.9 | 2.1 |
| Y4 |  | 1.8 | 1.7 |  | 1.7 | 1.8 |
| Y5 |  | 2.1 | 1.9 | 1.7 | 1.6 | 1.5 |
| Y6 |  | 2.2 | 2.0 | 1.7 | 1.5 | 1.3 |
| Y7 |  | 2.5 | 2.1 | 1.7 | 1.4 | 1.1 |
| Y8 |  |  |  |  |  |  |

FIG.17

|  | X1 | X2 | X3 | X4 | X5 | X6 |
|---|---|---|---|---|---|---|
| Y1 |  | × | × | × | ○ | ○ |
| Y2 |  | × | × | × | ○ | ○ |
| Y3 |  | × | × | × | ○ | ○ |
| Y4 |  | × | × |  | × | × |
| Y5 |  | ○ | ○ | × | × | × |
| Y6 |  | ○ | ○ | × | × | × |
| Y7 |  | ○ | ○ | × | × | × |
| Y8 |  |  |  |  |  |  |

FIG.18

| | X1 | X2 | X3 | X4 | X5 | X6 |
|---|---|---|---|---|---|---|
| Y1 | | 0.1 | 0.2 | 0.3 | 0.4 | |
| Y2 | 0.1 | 0.4 | 0.6 | 0.8 | 1.1 | 1.4 |
| Y3 | 0.2 | 0.5 | 0.9 | 1.2 | 1.5 | 1.9 |
| Y4 | 0.2 | 0.7 | 1.1 | 1.5 | 1.9 | 2.3 |
| Y5 | 0.2 | 0.7 | 1.2 | 1.6 | 2.1 | 2.6 |
| Y6 | 0.3 | 0.8 | 1.3 | 1.8 | 2.3 | 2.9 |
| Y7 | 0.3 | 0.8 | 1.3 | 1.8 | 2.4 | 3.2 |
| Y8 | | 0.8 | 1.3 | 1.9 | 2.7 | |

| | X1 | X2 | X3 | X4 | X5 | X6 |
|---|---|---|---|---|---|---|
| Y1 | | 0.8 | 0.4 | -0.1 | -0.4 | -0.7 |
| Y2 | | 0.6 | 0.3 | 0.0 | -0.2 | -0.5 |
| Y3 | | 0.4 | 0.2 | 0.0 | -0.1 | -0.2 |
| Y4 | | 0.1 | 0.0 | | 0.0 | 0.1 |
| Y5 | | -0.2 | -0.1 | 0.0 | 0.2 | 0.4 |
| Y6 | | -0.5 | -0.2 | 0.0 | 0.3 | 0.6 |
| Y7 | | -0.7 | -0.4 | -0.1 | 0.4 | 0.8 |
| Y8 | | | | | | |

FIG.20

| | X1 | X2 | X3 | X4 | X5 | X6 |
|---|---|---|---|---|---|---|
| Y1 | | 0.8 | 0.4 | 0.0 | 0.0 | 0.0 |
| Y2 | | 0.6 | 0.3 | 0.0 | 0.0 | 0.0 |
| Y3 | | 0.4 | 0.2 | 0.0 | 0.0 | 0.0 |
| Y4 | | 0.0 | 0.0 | | 0.0 | 0.0 |
| Y5 | | 0.0 | 0.0 | 0.0 | 0.2 | 0.4 |
| Y6 | | 0.0 | 0.0 | 0.0 | 0.3 | 0.6 |
| Y7 | | 0.0 | 0.0 | 0.0 | 0.4 | 0.8 |
| Y8 | | | | | | |

FIG.21

|    | X1  | X2  | X3  | X4  | X5  | X6  |
|----|-----|-----|-----|-----|-----|-----|
| Y1 |     | 0.8 | 1.3 | 1.9 | 2.6 |     |
| Y2 | 0.3 | 0.8 | 1.3 | 1.9 | 2.5 | 3.2 |
| Y3 | 0.3 | 0.8 | 1.3 | 1.8 | 2.4 | 2.9 |
| Y4 | 0.2 | 0.7 | 1.2 | 1.7 | 2.2 | 2.6 |
| Y5 | 0.2 | 0.7 | 1.1 | 1.5 | 1.9 | 2.3 |
| Y6 | 0.2 | 0.5 | 0.9 | 1.3 | 1.6 | 1.9 |
| Y7 | 0.1 | 0.4 | 0.6 | 0.9 | 1.2 | 1.5 |
| Y8 |     | 0.2 | 0.2 | 0.4 | 0.5 |     |

FIG.22

|    | X1 | X2   | X3   | X4  | X5   | X6   |
|----|----|------|------|-----|------|------|
| Y1 |    | -0.6 | -0.3 | 0.0 | 0.4  | 0.8  |
| Y2 |    | -0.4 | -0.2 | 0.0 | 0.3  | 0.6  |
| Y3 |    | -0.2 | -0.1 | 0.0 | 0.2  | 0.4  |
| Y4 |    | 0.1  | 0.0  |     | 0.0  | 0.1  |
| Y5 |    | 0.4  | 0.2  | 0.0 | -0.1 | -0.2 |
| Y6 |    | 0.6  | 0.3  | 0.0 | -0.2 | -0.4 |
| Y7 |    | 0.8  | 0.4  | 0.0 | -0.3 | -0.6 |
| Y8 |    |      |      |     |      |      |

FIG.23

|    | X1 | X2  | X3  | X4  | X5  | X6  |
|----|----|-----|-----|-----|-----|-----|
| Y1 |    | 0.0 | 0.0 | 0.0 | 0.4 | 0.8 |
| Y2 |    | 0.0 | 0.0 | 0.0 | 0.3 | 0.6 |
| Y3 |    | 0.0 | 0.0 | 0.0 | 0.2 | 0.4 |
| Y4 |    | 0.0 | 0.0 |     | 0.0 | 0.0 |
| Y5 |    | 0.4 | 0.2 | 0.0 | 0.0 | 0.0 |
| Y6 |    | 0.6 | 0.3 | 0.0 | 0.0 | 0.0 |
| Y7 |    | 0.8 | 0.4 | 0.0 | 0.0 | 0.0 |
| Y8 |    |     |     |     |     |     |

|    | X1 | X2  | X3  | X4  | X5  | X6  |
|----|----|-----|-----|-----|-----|-----|
| Y1 |    | 0.8 | 0.4 | 0.0 | 0.4 | 0.8 |
| Y2 |    | 0.6 | 0.3 | 0.0 | 0.3 | 0.6 |
| Y3 |    | 0.4 | 0.2 | 0.0 | 0.2 | 0.4 |
| Y4 |    | 0.0 | 0.0 |     | 0.0 | 0.0 |
| Y5 |    | 0.4 | 0.2 | 0.0 | 0.2 | 0.4 |
| Y6 |    | 0.6 | 0.3 | 0.0 | 0.3 | 0.6 |
| Y7 |    | 0.8 | 0.4 | 0.0 | 0.4 | 0.8 |
| Y8 |    |     |     |     |     |     |

METHOD OF DETECTING CONTACT STATE OF RESISTIVE TOUCH PANEL DEVICE, TOUCH PANEL DEVICE, AND DISPLAY DEVICE

CROSS-REFERENCE TO RELATED APPLICATIONS

This application is based upon and claims the benefit of priority from prior Japanese Patent Applications No. 2010-046906, filed Mar. 3, 2010; and No. 2010-284213, filed Dec. 21, 2010, the entire contents of both of which are incorporated herein by reference.

BACKGROUND OF THE INVENTION

1. Field of the Invention

The present invention relates to a method for detecting a contact state of a resistive touch panel device, a resistive touch panel device, and a display device, and more particularly to a method for detecting a contact state of a resistive touch panel device, a resistive touch panel device and a display device capable of detecting a distance between two points pressed simultaneously.

2. Description of the Related Art

A resistive touch panel device has a configuration in which a resistive film to be pressed and a resistive film opposite thereto are provided on surfaces facing each other of a substrate to be pressed and a substrate opposite thereto, respectively, such that the substrates are arranged opposite to each other at intervals. When the substrate to be pressed is touched from the surface opposite to the surface on which the resistive film to be pressed is formed and thereby bent, the resistive film to be pressed and the opposite resistive film will be locally made into contact, and the resistive film to be pressed and the opposite resistive film will be brought into electrical conduction at a contact point therebetween. In such a resistive touch panel device, a driving circuit alternately applies a voltage to between both ends of the resistive film to be pressed and both ends of the opposite resistive film, and detects the position of the contact point as a touched position.

The above-described type of resistive touch panel device derives the contact point through arithmetic processing based on the premise that the number of touched portions (press portions) is one. Accordingly, when more than one point is pressed simultaneously, the above-described pair of the resistive films will be brought into conduction at more than one contact point, and thereby false detection will be made that a midway position therebetween has been pressed. For example, Jpn. Pat. Appln. KOKAI Publication No. 8-241161 discloses a technique of determining that more than one point has been pressed based on a phenomenon that a resistance between the both ends of the above-described resistive film to be pressed will decrease when more than one point is pressed.

A touch panel device disclosed in Jpn. Pat. Appln. KOKAI Publication No. 8-241161 determines that a plurality of points have been pressed for the purpose of preventing error detection. On the other hand, as an input method of providing a variety of operations, a touch panel device has been desired that acquires information that more than one point has been simultaneously pressed as being significant. It is particularly meaningful to detect information on a distance between two points when the two points have been simultaneously pressed.

BRIEF SUMMARY OF THE INVENTION

It is therefore an object of the present invention to provide a method of detecting a contact state, a resistive touch panel device, and a display device, capable of detecting information on a distance between two points of a predetermined region when the two points have been simultaneously pressed.

According to an aspect of the invention, a method of detecting a contact state includes measuring, in a first state in which (i) a predetermined voltage is applied between a first end region and a second end region and (ii) a third end region is made open, a potential at a fourth end region as a first potential, the first end region being an end region of a first resistive film, as viewed in a first direction, the second end region being an end region of the first resistive film opposite to the first end region, the third end region being an end region of a second resistive film, as viewed in a second direction which intersects the first direction, and the fourth end region being an end region of the second resistive film opposite to the third end region; measuring, in a second state in which (i) the voltage is applied between the third end region and the fourth end region and (ii) the first end region is made open, a potential at the second end region as a second potential; measuring, in a third state in which (i) the first end region and the fourth end region are short-circuited and (ii) the voltage is applied between the first end region and the second end region, a potential at the third end region as a third potential; measuring, in a fourth state in which (i) the first end region and the third end region are short-circuited and (ii) the voltage is applied between the first end region and the second end region, a potential at the fourth end region as a fourth potential; and deriving distance information between two points when the first resistive film contacts the second resistive film at the two points, based on the first potential, the second potential, the third potential and the fourth potential.

According to another aspect of the invention, a resistive touch panel device includes a touch panel including (i) a first resistive film, and (ii) a second resistive film which faces the first resistive film; and a driving circuit configured to perform (i) measuring, in a first state in which (a) a predetermined voltage is applied between a first end region and a second end region and (b) a third end region is made open, a potential at a fourth end region as a first potential, the first end region being an end region of a first resistive film, as viewed in a first direction, the second end region being an end region of the first resistive film opposite to the first end region, the third end region being an end region of a second resistive film, as viewed in a second direction which intersects the first direction, and the fourth end region being an end region of the second resistive film opposite to the third end region; (ii) measuring, in a second state in which (a) the voltage is applied between the third end region and the fourth end region and (b) the first end region is made open, a potential at the second end region as a second potential; (iii) measuring, in a third state in which (a) the first end region and the fourth end region are short-circuited and (b) the voltage is applied between the first end region and the second end region, a potential at the third end region as a third potential; (iv) measuring, in a fourth state in which (a) the first end region and the third end region are short-circuited and (b) the voltage is applied between the first end region and the second end region, a potential at the fourth end region as a fourth potential; and (v) deriving distance information between two points when the first resistive film contacts the second resistive film at the two points, based on the first potential, the second potential, the third potential and the fourth potential.

According to another aspect of the invention, a display device includes a display panel which displays an image; a touch panel including (i) a first resistive film, and (ii) a second resistive film which faces the first resistive film; and a driving circuit configured to perform (i) measuring, in a first state in which (a) a predetermined voltage is applied between a first end region and a second end region and (b) a third end region is made open, a potential at a fourth end region as a first potential, the first end region being an end region of a first resistive film, as viewed in a first direction, the second end region being an end region of the first resistive film opposite to the first end region, the third end region being an end region of a second resistive film, as viewed in a second direction which intersects the first direction, and the fourth end region being an end region of the second resistive film opposite to the third end region; (ii) measuring, in a second state in which (a) the voltage is applied between the third end region and the fourth end region and (b) the first end region is made open, a potential at the second end region as a second potential; (iii) measuring, in a third state in which (a) the first end region and the fourth end region are short-circuited and (b) the voltage is applied between the first end region and the second end region, a potential at the third end region as a third potential; (iv) measuring, in a fourth state in which (a) the first end region and the third end region are short-circuited and (b) the voltage is applied between the first end region and the second end region, a potential at the fourth end region as a fourth potential; and (v) deriving distance information between two points when the first resistive film contacts the second resistive film at the two points, based on the first potential, the second potential, the third potential and the fourth potential.

According to the present invention, it is possible to detect information on a distance between two points within a predetermined region when the two points have been simultaneously pressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 8 is a circuit diagram illustrating a second state set by the driving circuit;

FIG. 9 illustrates an example of potentials detected in the second state;

FIG. 12 illustrates an example of potentials that are detected when two points have been touched in the third state;

FIG. 13 illustrates determination of the difference between the detected potential and the value of the YU ground table;

FIG. 16 illustrates potentials that are detected when two points have been touched in the fourth state;

FIG. 17 illustrates determination of differences between the detected potential and the value of the YD ground table;

FIG. 18 illustrates an example of a multi-touch amplitude reference value YU ground table stored in advance in the storage module;

FIG. 19 illustrates differences between the detected potential and the value of the multi-touch amplitude reference value YU ground table;

FIG. 20 illustrates results obtained by comparing the values shown in FIG. 19 and a third threshold value;

FIG. 21 illustrates an example of a multi-touch amplitude reference value YD ground table stored in advance in the storage module;

FIG. 22 illustrates differences between the detected potential and the value of the multi-touch amplitude reference value YD ground table;

FIG. 23 illustrates a result obtained by comparing the value shown in FIG. 22 and a fourth threshold value;

DETAILED DESCRIPTION OF THE INVENTION

An embodiment of the present invention will be described below, with reference to the accompanying drawings.

Figure 1:
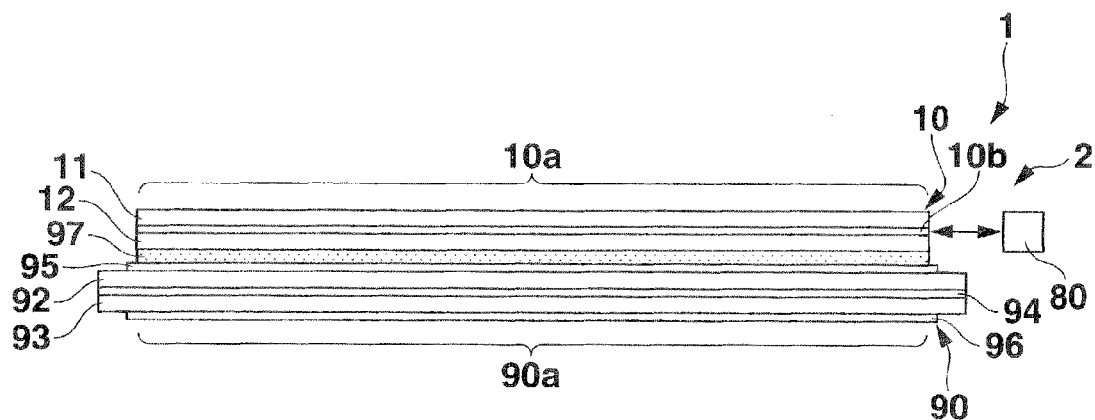
FIG. 1 is a side view illustrating a configuration example of a display device comprising a touch panel device.

FIG. 1 is a schematic side view of a touch panel device 2 of the present embodiment when the touch panel device 2 is mounted to a display device 1. The display device 1 comprises a display panel 90 configured to display an image on an image display region 90a, and a touch panel device 2 including a touch detection region 10a arranged so as to face the image display region 90a of the display panel 90. The touch panel device 2 is arranged on the side from which the user observes an image displayed on the image display region 90a, with respect to the display panel 90.

The display panel 90 includes a plurality of pixels arranged in the image display region 90a, and is an active matrix liquid display panel 90, for example. The active matrix liquid crystal display panel 90 includes a pair of transparent substrates 92, 93 arranged so as opposite to each other at a predetermined interval, bonded with a frame-shaped sealing member 94 at the circumferential portion and formed of glass, for example. The pair of substrates 92, 93 are interposed by a pair of polarizing plates 95, 96. In the description that follows, one of the pair of substrates 92, 93 arranged at the side closer to the touch panel device 2 will be referred to as a observation-side substrate 92, and the other of the pair of substrates 92, 93 arranged on the side farther from the touch panel device 2 will be referred to as a rear substrate 93. Further, one of the pair of the polarizing plates 95, 96 arranged at the side closer to the touch panel device 2 will be referred to as a observation-side polarizing plates 95, and the other of the pair of the polarizing plates 95, 96 arranged on the side farther from the touch panel device 2 will be referred to as a rear polarizing plate 96.

On the surface of the observation-side substrate 92 facing the rear substrate 93, a common electrode formed of a transparent conductive material, such as indium tin oxide, into a shape of one film, is provided. On the surface of the rear substrate 93 facing the observation-side substrate 92, a plurality of pixel electrodes are provided so as to face the common electrode. Each of the pixel electrodes is connected to a thin-film transistor. In a region of the gap between the observation-side substrate 92 and the rear substrate 93 that is surrounded by the sealing member 94, liquid crystals are sealed. That is, the active matrix liquid crystal display panel 90 is configured such that a plurality of pixels are arranged in the image display region 90a, such that a liquid crystal layer is provided between the pixel electrode connected to the thin-film transistor and the common electrode facing the pixel electrode in each of the pixels. By controlling the potential difference between the pixel electrode and the common electrode, the orientation state of the liquid crystals vary, and thereby the amount of light transmitted through the display panel 90 can be controlled.

The orientation mode of the liquid crystal layer may be any of a twisted nematic type, a super-twisted nematic type, or a non-twisted homogeneous type, a vertically-aligned type, and a bend-aligned type. The dielectric constant anisotropy of the liquid crystals sealed in the liquid crystal layer may be positive or negative. Furthermore, the liquid crystals may be ferroelectric or antiferroelectric. The display panel 90 may be configured to control the orientation state of the liquid crystals through an in-plane electric field as well as a vertical electric field. Moreover, the display panel 90 is not limited to a liquid crystal display panel, and may be a display panel using an organic electroluminescence (EL).

The touch panel device 2 includes a touch panel 10 including a touch detection region 10a, and a driving circuit 80 configured to detect a touched position on the touch detection region 10a.

The touch panel 10 includes a pair of substrates 11, 12 formed of a transparent material. Hereinafter, one of the pair of substrates 11, 12 arranged farther from the display panel 90 will be referred to as a first substrate 11, and the other substrate arranged closer to the display panel 90 will be referred to as a second substrate 12.

The touch panel 10 is integrally formed with the display panel 90 by bonding the second substrate 12 to the observation-side polarizing plates 95 of the display panel 90 with an adhesive layer 97 formed of a transparent adhesive material, resin, or the like.

The configuration of the touch panel 10 will be described in detail below. The first substrate 11 is a glass plate, a resin film, or the like, formed in the shape of a rectangular shape. The second substrate 12 is a glass plate, for example, formed in the shape of a rectangular shape having approximately the same size as that of the first substrate 11, for example.

Figure 2:
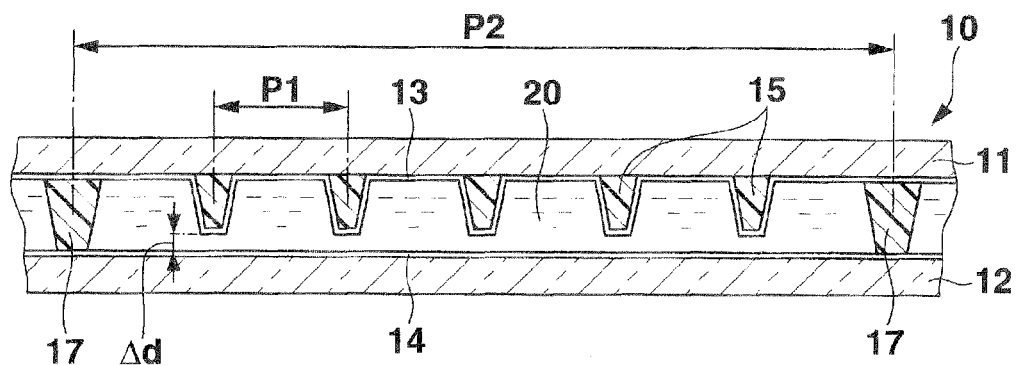
FIG. 2 is an example of an exploded cross-sectional view of the touch panel device.

As shown in FIG. 2, a transparent second resistive film 14 formed of indium tin oxide (ITO), for example, is formed on the surface of the second substrate 12 facing the first substrate 11.

On the surface of the first substrate 11 facing the second substrate 12, a plurality of projections 15 formed of a transparent insulating material are formed. The projections 15 are arranged in a matrix pattern such that the projections 15 are arranged at the equal interval of P1 in any of the two directions crossing in the substrate plane (excluding the position in which a spacer 17, which will be described later, is arranged) so as to correspond to the touch detection region 10a. The heights of the projections 15 are configured to be equal to one another.

On the first substrate 11, a transparent first resistive film 13, formed of an indium tin oxide (ITO), for example, is provided, so as to cover the projections 15. The first resistive film 13 and the second resistive film 14 are formed in a range broader than the touch detection region 10a.

On the first substrate 11, a plurality of spacers 17 formed of a transparent insulating material is provided on the first resistive film 13. The spacers 17 are arranged in a matrix such that the spacers 17 are arranged at an interval P2, which is an integral multiple of the interval P1, at which the projections 15 are arranged, and the spacers 17 are positioned at the midpoint of two adjacent projections 15.

In other words, the projections 15 are arranged under the first resistive film 13 at the interval of P1 in principle, but are not arranged at the interval of P2 exceptionally, and the spacer 17 is arranged at that position on the first resistive film 13 instead.

The heights of the spacers 17 are formed so as to be equal to one another and higher than the heights of the projections 15. Accordingly, when the second substrate is layered on the first substrate 11 such that the first resistive film 13 and the second resistive film 14 face each other, the top portions of the spacers 17 are made into contact with the second resistive film 14. Thereby, the two substrates are maintained parallel to each other by the spacers 17. In this case, a gap Δd, corresponding to the difference in height between the height of the projections 15 and the height of the spacers 17, is formed between the second resistive film 14 and a region of the first resistive film 13 covering the top portion of the projections 15.

The first substrate 11 and the second substrate 12 are bonded with a sealing member 10b applied in the shape of a frame surrounding the touch detection region, so as to be in the above-described state. In the space formed by being surrounded by the frame-shaped sealing member 10b, an insulating liquid body 20 is filled. The insulating liquid body 20 is designed to decrease difference in optical refraction index between the space and the first substrate 11, the second substrate 12, the first resistive film 13 and the second resistive film 14. The difference in optical refraction index between the space and the first substrate 11, the second substrate 12, the first resistive film 13 and the second resistive film 14 is smaller than that between air and the first substrate 11, the second substrate 12, the first resistive film 13 and the second resistive film 14. The difference in optical refraction index between the insulating liquid body 20 and the substrates 11 and 12 is preferably less than or equal to 0.1, for example.

An $SiO_2$ film is preferably formed in advance as a base coat on each of the surfaces of the first substrate 11 and the second substrate 12, the surfaces facing each other. That is, the second resistive film 14 is preferably formed on the surface of the second substrate 12 facing the first substrate 11 after the $SiO_2$ film is formed as a base coat. The projections 15 are preferably formed on the surface of the first substrate 11 facing the second substrate 12 after the $SiO_2$ film is formed as a base coat.

With the above-described configuration, when the first substrate 11 is pressed by a touch from an external surface in the touch panel 10, a region of the first substrate 11 corresponding to the pressed position is bent toward the second substrate 12, and a portion of the first resistive film 13 positioned at this region will be made into contact the second resistive film 14 at the top portions of the projections 15. As a result thereof, the first resistive film 13 and the second resistive film 14 will be electrically brought into conduction in a region corresponding to the pressed position. The driving circuit 80 detects the touched positioned based on the electrical conduction, as will be described later.

Figure 3:
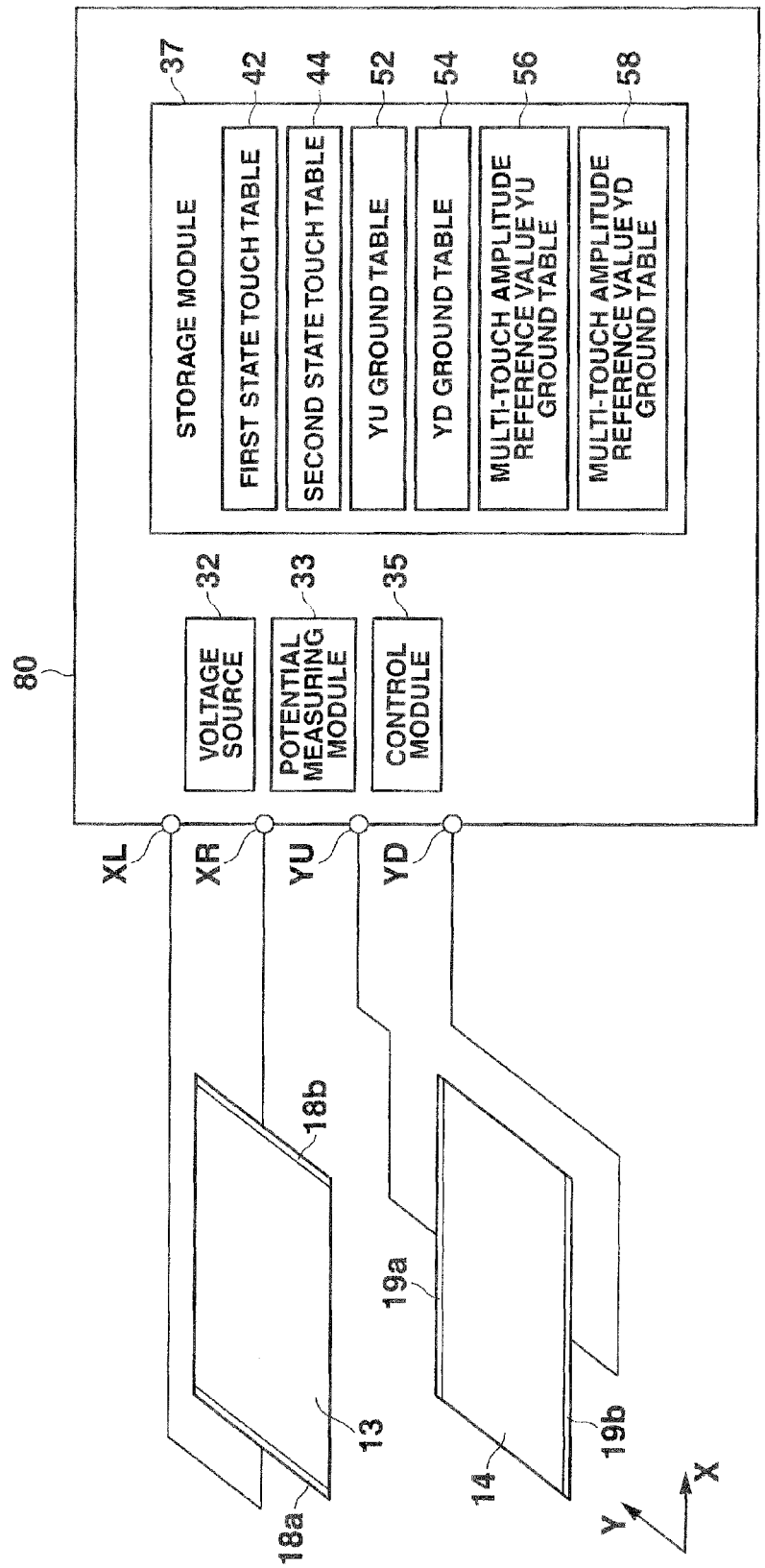
FIG. 3 illustrates an example of an overall configuration of the touch panel device.

A description will be further made by referring to the direction parallel to the side extending in the lateral direction as the X-direction, and the direction parallel to the side extending in the vertical direction as the Y-direction, of the sides of the touch panel 10 formed in a rectangular shape from a plane shape, as shown in FIG. 3.

In the first resistive film 13, a belt-shaped low-resistance electrode is formed along the Y-direction at an end region of the X-direction and an end region of a direction opposite to the X-direction (both end regions of an X-axis). That is, in the first resistive film 13, a belt-shaped left-end electrode 18a is formed as a first X-axis electrode at one edge portion (on the left side of the drawing) of the X-axis, and a belt-shaped right-end electrode 18b is formed as a second X-axis electrode at the other edge portion (on the right side of the drawing) of the X-axis. The length of the left-end electrode 18a and the right-end electrode 18b, as viewed in the Y-direction, are equal to the length of the first resistive film 13, as viewed in the Y-direction.

In the second resistive film 14, a belt-shaped low-resistance electrode is formed along the X-direction at an end region of the Y-direction and an end region of a direction opposite to the Y-direction (both end regions of a Y-axis). That is, in the second resistive film 14, a belt-shaped upper-end electrode 19a is formed as a first Y-axis electrode at one edge portion (on the upper side of the drawing) in the Y-axis, and a belt-shaped lower-end electrode 19b is formed as a second Y-axis electrode at the other edge portion (on the lower side of the drawing) in the Y-axis. The length of the upper-end electrode 19a and the lower-end electrode 19b, as viewed in the X-direction, are equal to the length of the second resistive film 14, as viewed in the X-direction.

The left-end electrode 18a is connected to the driving circuit 80 via a terminal XL. The right-end electrode 18b is connected to the driving circuit 80 via a terminal XR. The upper-end electrode 19a is connected to the driving circuit 80 via a terminal YU. The lower-end electrode 19b is connected to the driving circuit 80 via a terminal YD.

The driving circuit 80 includes a voltage source 32, a potential measuring module 33, a control module 35, and a storage module 37, such as a memory.

The voltage source 32 is a voltage source of a voltage applied to the right-end electrode 18b via terminal XR, or to the upper-end electrode 19a via terminal YU. The potential measurement module 33 is an electrometer module designed to measure the potential of the right-end electrode 18b via terminal XR, the upper-end electrode 19a via terminal YU, or the lower-end electrode 19b via terminal YD. The potential measurement module 33 is an analog-to-digital converter, for example, and outputs a digital value of the potential to the control module 35. The control module 35 is designed to control the entire touch panel device 2, and also functions as a computing module designed to perform arithmetic processing for detection of a touched position. The storage module 37 stores in advance "first state touch table 42", "second state touch table 44", "YU ground table 52", "YD ground table 54", "Multi-touch amplitude reference value YU ground table 56", "Multi-touch amplitude reference value YD ground table 58", and the like, which will be described later.

Figure 4:
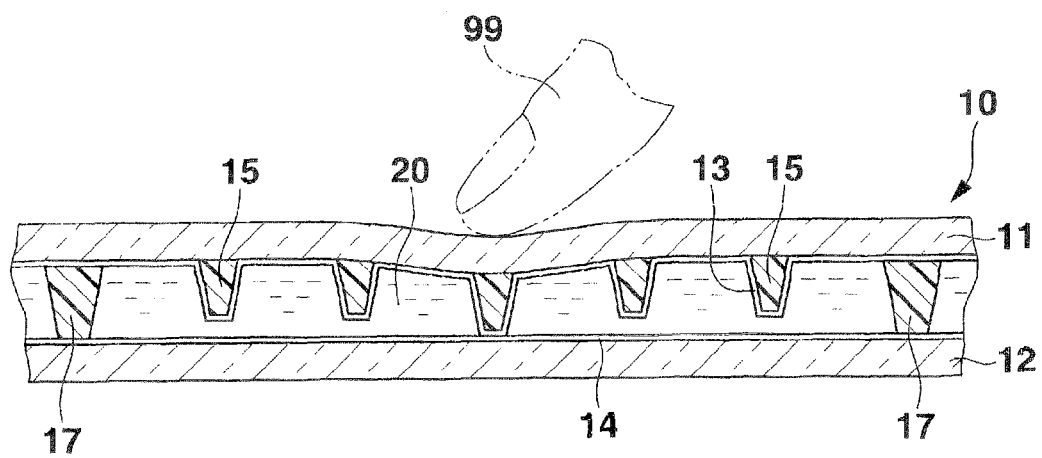
FIG. 4 is a cross-sectional view illustrating the state of the touch panel device when a portion of the touch panel device has been touched.

The operation of the touch panel device 2 according to the present embodiment will be described. When the touch panel 10 is pressed by a touch of a finger 99, for example, on the first substrate 11 from an external surface, a region of the first substrate 11 corresponding to the pressed position will be bent toward the second substrate 12, as shown in FIG. 4. In this case, a portion of the first resistive film 13 positioned in this region will be made into contact with the second resistive film 14 at the top portion of the projections 15. As a result thereof, the first resistive film 13 and the second resistive film 14 will be electrically brought into conduction in a region corresponding to the pressed position.

In FIG. 4, the scale of the projections 15, for example, is different from the actual scale and is enlarged for emphasis for the sake of simplicity. FIG. 4 shows a state in which the first substrate 11 is pressed by a finger and thereby the first resistive film 13 is made into contact with the second resistive film 14 on the one projection 15. However, the description that follows is similarly applicable to a case where the first resistive film 13 is made into contact with the second resistive film 14 on a plurality of the projections 15 adjacent to one another when one portion has been pressed.

A method of detecting the touched position will be described with reference to the flowchart shown in FIG. 5. In this detection method, it is possible to determine whether one point has been touched or two points have been simultaneously touched in the touch detection region. Furthermore, when two points have been simultaneously touched, it is possible to detect the distance between the two points. That is, it is possible to determine whether one point is in contact or two points are simultaneously in contact as a contact state between the first resistive film 13 and the second resistive film 14. Furthermore, when two points are simultaneously in contact, it is also possible to detect distance between the two points.

Figures 6, 7:
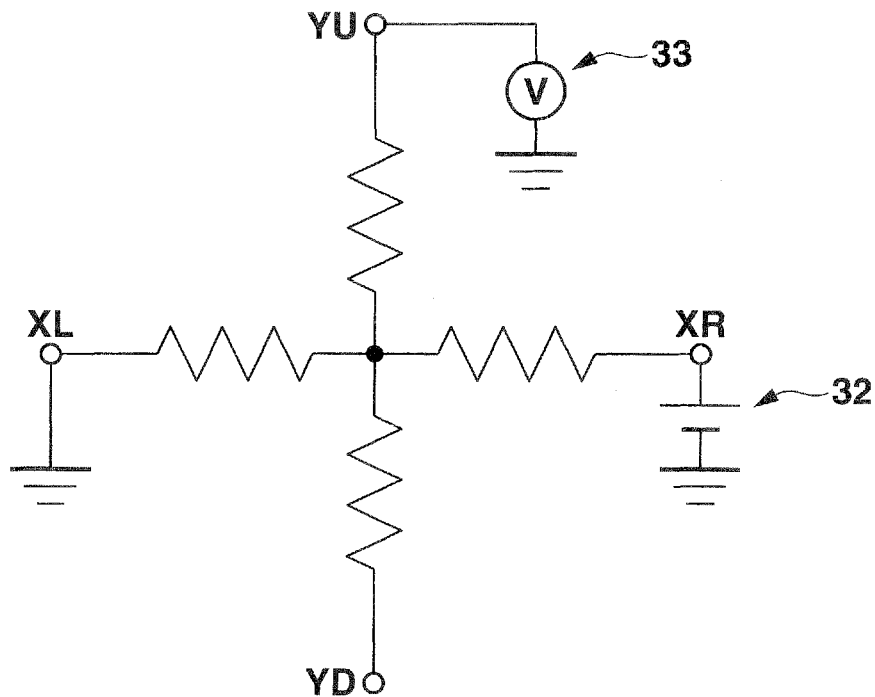
FIG. 6 is a circuit diagram illustrating a first state set by a driving circuit.
FIG. 7 illustrates an example of potentials detected in the first state.

First, in step S1, the control module 35 grounds terminal XL and connects the voltage source 32 to terminal XR and applies a voltage thereto, as shown in FIG. 6. At the same time, terminal YD is not connected to anything, and the potential measurement module 33 is connected to terminal YU. This state will be referred to as a first state. That is, in the first state, a voltage is applied between the both ends 18a, 18b of the first resistive film 13, as viewed in the X-axis, and one end 19b of the second resistive film 14, as viewed in the Y-axis, is made open. The potential measurement unit 33 is connected such that the potential at the other end 19a of the second resistive film 14, as viewed in the Y-axis, can be measured.

As described above, for example, the left-end electrode 18a functions as a first end region. For example, the right-end electrode 18b functions as a second end region. For example, the lower-end electrode 19b functions as a third end region. For example, the upper-end electrode 19a functions as a fourth end region.

Assume that, in the X-direction of the first resistive film 13, the value of an X-coordinate at the end of the side on which the left-end electrode 18a is arranged is 0, the value of an X-coordinate at the end of the side on which the right-end electrode 18b is arranged is 1, the value of an X-coordinate at a touched position when one point has been touched is x, the resistance value between the both ends of the X-axis of the first resistive film 13 is rx, and the inner resistance value of the potential measuring module 33 is R. In the first state, the voltage applied between the both ends, as viewed in the X-axis, of the first resistive film 13 by the voltage source 32 is V0, since rx<<R, the potential V(x) measured by the potential measuring module 33 can be expressed as follows:

$$V(x)=V0 \cdot x \quad (1).$$

In this way, in the first state, the value of one touched X-coordinate can be detected based on the potential V(x) measured by the potential measuring module 33, when the number of touched positions is only one.

In the description of the present embodiment that follows, coordinates expressed by a matrix obtained by dividing the touch detection region 10a of the touch panel 10 into 6 divisions (X1-X6) in the X-direction, and into 8 divisions (Y1-Y8) in the Y-direction, will be used as an example. In the X-direction, X1 is on the side of the left-end electrode 18a, and X6 is on the side of the right-end electrode 18b. In the Y-direction, Y1 is on the side of the upper-end electrode 19a, and Y8 is on the side of the lower-end electrode 19b. In this example, a description will be made by showing an example of a potential measured when the voltage of the voltage source is set to 5.0 V.

FIG. 7 shows an example of the relationship between the touched position and the potential measured by the potential measuring module 33 when only one point has been touched in the touch detection region 10a in the first state. As shown in FIG. 7, in the X-direction, since different potentials can be detected according to the touched position, the control module 35 is capable of determining the value of the X-coordinate at the touched position based on the potential measured by the potential measuring module 33.

When two points are simultaneously touched in the first state, however, since the potential measured by the potential measuring module 33 will be the same as that as shown in FIG. 7, the control module 35 cannot determine whether only one point has been touched or two points have been touched at this stage. Accordingly, at this stage, even when only one point has been touched in actuality, the control module 35 cannot determine the value of the X-coordinate at the touched position.

That is, when two points are touched simultaneously in the first state, since the potential measured by the potential measuring module 33 will be equal to the potential of the case where the position in the midpoint of the touched two points has been touched as this only one position, the control module 35 cannot determine whether one point has been touched or two points have been touched at this stage. For example, when the two points of coordinates (X5, Y1) and (X3, Y7) are simultaneously touched, the potential measured by the potential measuring module 33 will be 2.9 V, which is the same as that of the case where only one point corresponding to X4 has been touched.

In step S1, the control module 35 obtains a potential V(X0) measured by the potential measuring module 33 in the first state, regardless of whether one point has been touched or two points have been simultaneously touched. The control module 35 derives the value X0 of the X-coordinate as first reference data, based on the obtained potential V(X0) and the equation (1). In this case, X0 indicates the value of the X-coordinate in the touched position when one point has been touched, and the value of the X-coordinate in a midpoint between the touched two points when two points have been simultaneously touched.

The value X0 of the X-coordinate is not limited the value obtained based on the acquired potential V(X0) and the equation (1). For example, the relationship between the touched position and the potential measured by the potential measuring module 33 when only one point has been touched in the touch detection region 10a in the first state is acquired in advance as a first state touch table 42, as shown in FIG. 7, and the table is stored in the storage module 37. The control module 35 may derive the value X0 of the X-coordinate based on the acquired potential V(X0) by referring to the first state touch table 42.

In step S2, the control module 35 applies a voltage of 5 V by connecting the voltage source 32 to terminal YU and grounds terminal YD. At the same time, terminal XL is not connected to anything, and the potential measuring module 33 is connected to terminal XR. This state will be referred to as a second state. That is, in the second state, a voltage is applied between the both ends 19a, 19b, as viewed in the Y-axis, of the second resistive film 14, and one end 18a of the first resistive film 13, as viewed in the X-axis, is made open. The potential measuring module 33 is connected such that a potential at the other end 18b of the first resistive film 13, as viewed in the X-axis, can be measured.

In this case, in the Y-direction of the first resistive film 13, assume that the value of the Y-coordinate at the end of the side on which the upper-end electrode 19a is provided is 0, the value of the Y-coordinate at the end of the side on which the lower-end electrode 19b is provided is 1, the value of the Y-coordinate at the touched positioned when one point has been touched is y, the resistance value between the both ends in the Y-axis of the first resistive film 13 is ry, and the inner resistance value of the potential measuring module 33 is R. In the second state, assuming that the voltage applied to between the both ends, as viewed in the Y-axis, of the first resistive film 13 by the voltage source 32 is V0, since ry<<R, the potential V(y) measured by the potential measuring module 33 can be expressed as follows:

$$V(y)=V0 \cdot y \quad (2).$$

In this way, in the second state, when only one point has been touched, the value of the Y-coordinate of the touched one point can be detected based on the potential measured by the potential measuring module 33.

FIG. 9 shows an example of the relationship between the touched position and the potential measured by the potential measuring module 33 when only one point has been touched in the touch detection region 10a in the second state. As shown in FIG. 9, in the Y-direction, since different potentials can be detected according to the touched position, when only one point is touched, the control module 35 can determine the value of the Y-coordinate at the touched position based on the potential measured by the potential measuring module When two points have been simultaneously touched in the second state, however, the potential measured by the potential measuring module 33 will be similar to the potential shown in FIG. 9, and the control module 35 cannot determine whether only one point has been touched or two points have been touched at this stage. Accordingly, even if only one point has been touched in actuality, the control module 35 cannot determine the position of the Y-coordinate at the touched position at this stage.

When two points have been touched simultaneously in the second state, the potential measured by the potential measuring module 33 will be equal to the potential of the case where a midpoint of the two touched points has been touched as only one touched position, and the control module 35 cannot determine whether one point has been touched or two points have been touched at this stage. For example, when two points of coordinate (X5, Y1) and coordinate (X3, Y7) are simultaneously touched, the potential measured by the potential measuring module 33 will be 2.8 V, which is the same as the case where only one point corresponding to Y4 has been touched.

In step S2, the control module 35 acquires a potential V(Y0) measured by the potential measuring module 33 in the second state, regardless of whether one point has been touched or two points have been simultaneously touched. The control module 35 derives the value Y0 of the Y-coordinate as the second reference data based on the acquired potential V(Y0) and the equation (2). In this case, Y0 indicates a Y-coordinate of the touched position when one point has been touched, and the value of the Y-coordinate in the position of the midpoint between the two touched points when two points have been simultaneously touched.

The value Y0 of the Y-coordinate is not limited to the value obtained based on the acquired potential V(Y0) and the equation (2). For example, the relationship between the touched position and the potential measured by the potential measuring module 33 when only one point has been touched in the touch detection region 10a in the second state is acquired as a second state touch table 44, as shown in FIG. 9, and the table is stored in the storage module 37. The control module 35 may refer to the second state touch table 44 and derive the value Y0 of the Y-coordinate based on the acquired potential V(Y0).

Figures 10, 11:
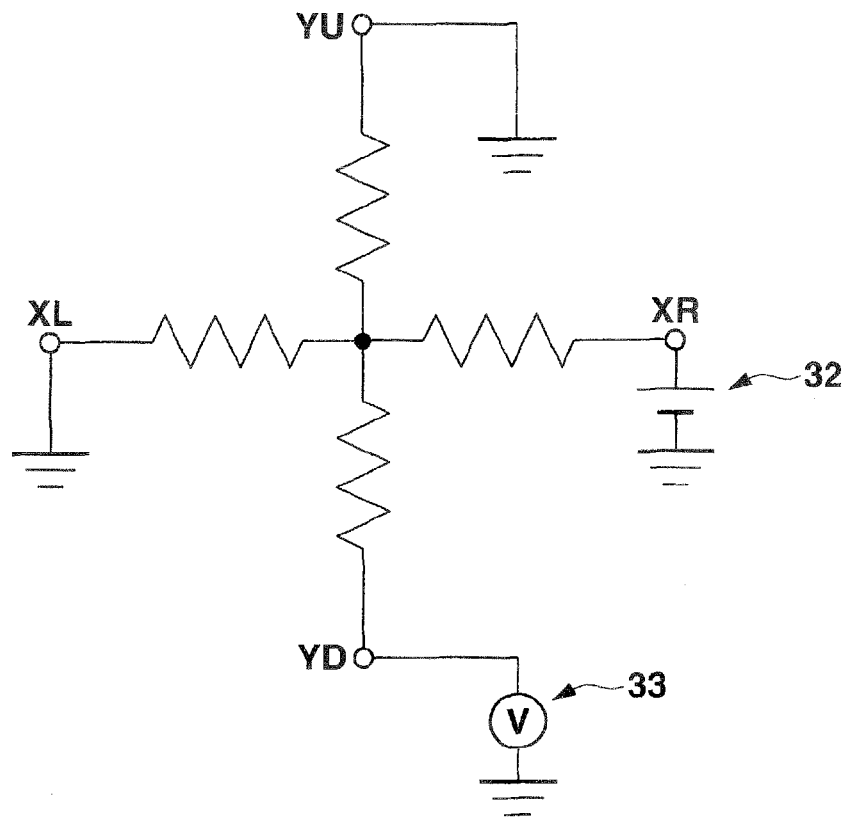
FIG. 10 is a circuit diagram illustrating a third state set by the driving circuit.
FIG. 11 illustrates an example of potentials that are detected when one point has been touched in the third state, and an example of a YU ground table stored in a storage module.

In step S3, the control module 35 applies a voltage of 5 V by connecting the voltage source 32 to terminal XR and grounds terminal XL, as shown in FIG. 10. At the same time, terminal YU is grounded and the potential measuring module 33 is connected to terminal YD. This state will be referred to as the third state. That is, in the third state, one end 18a of the first resistive film 13, as viewed in the X-axis, and the other end 19a of the second resistive film 14, as viewed in the Y-axis, are short-circuited, and the voltage is applied between the both ends 18a, 18b of the first resistive film 13, as viewed in the X-axis. The potential measuring module 33 is connected such that the potential at one end 19b of the second resistive film 14, as viewed in the Y-axis can be measured.

FIG. 11 shows an example of the relationship between the touched position and the potential measured by the potential measuring module 33 when only one point has been touched in the touch detection region 10a in the third state, as in the case of FIG. 7. The relationship shown in FIG. 11 will be referred to as YU ground table 52. In the present embodiment, the YU ground table 52 is acquired in advance and stored in the storage module 37. Since terminal XL and terminal YU are grounded, the YU ground table 52 has a low potential in the column of X1 and the row of Y1, and has a high potential at (X6, Y8).

In step S3, when only one point has been touched, the potential shown in the YU ground table 52 is measured by the potential measuring module 33, according to the touched position.

When two points have been touched, on the other hand, the following potential will be measured. That is, when two points of coordinates (X5, Y1) and (X3, Y7), at which a voltage of 2.9 V is detected in step S1 and a voltage of 2.8 V is detected in step S2, have been simultaneously touched, for example, a voltage of 1.1 V will be detected.

In this concrete example, there are 17 pairs of touched positions at which a voltage of 2.9 V is detected in step S1 and a voltage of 2.8 V is detected in step S2, as a result of two points being simultaneously touched. FIG. 12 illustrates the relationship between the 17 pairs of touched positions and the potential measured by the potential measuring module 33. In FIG. 12, the same values are assigned to two points that are simultaneously touched. For example, FIG. 12 shows that a voltage of 1.0 V will be detected in step S3 when coordinates (X2, Y6) and (X6, Y2) are simultaneously touched. Further, when coordinates (X3, Y3) and (X5, Y5) are simultaneously touched, for example, a voltage of 1.7 V will be detected in step S3. As shown in FIG. 12, even when a voltage of 2.9 V is detected in step S1 and a voltage of 2.8 V is detected in step S2, the potential measured by the potential measuring module 33 will differ according to the combination of the two points that are simultaneously touched.

In FIG. 12, the potential of the column of X4 and the potential of the row of Y4 are approximately equal. This is because the potential gradation is constant and is not deflective along the column of X4 and the row of Y4. Accordingly, there will be no distinction between the potential of the case where coordinates (X4, Y1) and (X4, Y7) are simultaneously touched and the potential of the case where coordinates (X4, Y3) and (X4, Y5) are simultaneously touched, for example. Similarly, there will be no distinction between the potential of the case where coordinates (X2, Y4) and (X6, Y4) are simultaneously touched and the potential of the case where coordinates (X3, Y4) and (X5, Y4) are simultaneously touched, for example.

In step S3, the control module 35 acquires a potential V(S3) measured by the potential measuring module 33 in the third state regardless of whether one point has been touched or two points are simultaneously touched.

In step S4, the control module 35 reads the above-noted YU ground table 52 from the storage module 37. The control module 35 compares a value VYU(X0, Y0) of coordinates (X0, Y0) of the YU ground table 52 and V(S3) acquired in step S3, based on X0 obtained as the first reference data in step S1 and Y0 obtained as the second reference data in step S2. When the difference between VYU(X0, Y0) and V(S3) is greater than a predetermined first threshold value, the control module 35 shifts the procedure to step S8. When the difference between VYU(X0, Y0) and V(S3) is less than or equal to the first threshold value, the control module 35 shifts the procedure to step S5.

For example, assume that the first threshold value is 0.4. In the example shown in FIG. 11, VYU(X4, Y4)=1.0 V. Since V(S3) will be greater than or equal to 1.5 V when the coordinates with a "○" mark in FIG. 13 have been touched, the difference will be greater than the first threshold value, and the procedure will be shifted to step S8. Since V(S3) will be greater than or equal to 0.6 V and less than or equal to 1.4 V when the coordinates with an "×" mark are touched in FIG. 13, on the other hand, the difference will be less than or equal to the first threshold value, and the procedure will be shifted to step S5. In this example, the first threshold value is set to 0.4, but is adjusted according to the touch panel employed.

Figures 14, 15:
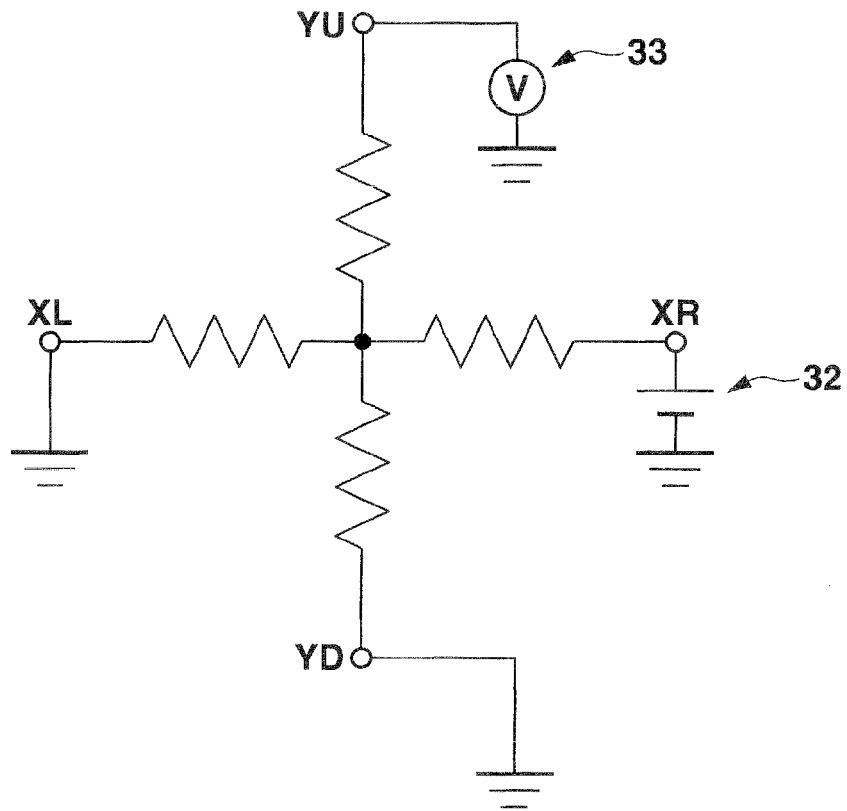
FIG. 14 is a circuit diagram illustrating a fourth state set by the driving circuit.
FIG. 15 illustrates an example of potentials that are detected when one point has been touched in the fourth state, and an example of the YU ground table stored in the storage module.

In step S5, the control module 35 applies a voltage of 5 V by connecting the voltage source 32 to terminal XR and grounds terminal XL, as shown in FIG. 14. At the same time, terminal YD is grounded and the potential measuring module 33 is connected to terminal YU. This state will be referred to as the fourth state. That is, in the fourth state, one end 18a of the first resistive film 13, as viewed in the X-axis, and one end 19b of the second resistive film 14, as viewed in the Y-axis, are short-circuited, and the voltage is applied between the both ends 18a, 18b, as viewed in the X-axis, of the first resistive film 13. The potential measuring module 33 is connected such that the potential at the other end 19a of the second resistive film 14, as viewed in the Y-axis, can be measured.

FIG. 15 shows an example of the relationship between the touched position and the potential measured by the potential measuring module 33 when only one point has been touched in the touch detection region 10a in the fourth state similar to the YU ground table 52 shown in FIG. 11. The relationship shown in FIG. 15 will be referred to as YU ground table 52. In the present embodiment, the YU ground table 52 is acquired in advance and stored in the storage module 37.

In step S5, when only one point has been touched, the potential shown in the YD ground table 54 is measured by the potential measuring module 33, according to the touched position.

When two points have been touched, on the other hand, the following potential will be measured. When two points of coordinates (X5, Y1) and (X3, Y7), at which a voltage of 2.9 V is detected in step S1 and a voltage of 2.8 V is detected in step S2, have been simultaneously touched, for example, a voltage of 2.1 V will be detected.

In this concrete example, there are 17 pairs of touched positions at which a voltage of 2.9 V is detected in step S1 and a voltage of 2.8 V is detected in step S2, as a result of two points being simultaneously touched. FIG. 16 illustrates the relationship between the 17 pairs of touched positions and the potential measured by the potential measuring module 33. In FIG. 16, the same values are assigned to two points that are simultaneously touched. For example, FIG. 16 shows that a voltage of 2.2 V will be detected in step S5 when coordinates (X2, Y6) and (X6, Y2) are simultaneously touched. Further, when coordinates (X3, Y3) and (X5, Y5) are simultaneously touched, for example, a voltage of 1.6 V will be detected in step S5. As shown in FIG. 16, even when a voltage of 2.9 V is detected in step S1 and a voltage of 2.8 V is detected in step S2, the potential measured by the potential measuring module 33 will differ according to the combination of the two points that are simultaneously touched.

In FIG. 12, the potential of the column of X4 and the potential of the row of Y4 are approximately equal. This is because the potential gradation is constant and is not deflective along the column of X4 and the row of Y4. Accordingly, there will be no distinction between the potential of the case where coordinates (X4, Y1) and (X4, Y7) are simultaneously touched and the potential of the case where coordinates (X4, Y3) and (X4, Y5) are simultaneously touched, for example. Similarly, there will be no distinction between the potential of the case where coordinates (X2, Y4) and (X6, Y4) are simultaneously touched and the potential of the case where coordinates (X3, Y4) and (X5, Y4) are simultaneously touched, for example.

In step S5, the control module 35 acquires a potential V(S5) measured by the potential measuring module 33 in the fourth state regardless of whether one point has been touched or two points are simultaneously touched.

In step S6, the control module 35 reads the above-noted YD ground table 54 from the storage module 37. The control module 35 compares a value VYD(X0, Y0) of coordinates (X0, Y0) of the YD ground table 54 and V(S5) acquired in step S5, based on X0 obtained as the first reference data in step S1 and Y0 obtained as the second reference data in step S2. When the difference between VYD(X0, Y0) and V(S5) is greater than a predetermined second threshold value, the control module 35 shifts the procedure to step S8. When the difference between VYD(X0, Y0) and V(S5) is less than or equal to the second threshold value, the control module 35 shifts the procedure to step S7.

For example, assume that the second threshold value is 0.6. In the example shown in FIG. 15, VYD(X4, Y4)=1.2 V. Since V(S5) will be greater than or equal to 1.9 V when the coordinates with a "○" mark in FIG. 17 have been touched, the difference will be greater than the second threshold value, and the procedure will be shifted to step S8. Since V(S5) will be greater than or equal to 0.6 V and less than or equal to 1.8 V when the coordinates with an "×" mark are touched in FIG. 17, on the other hand, the difference will be less than or equal to the second threshold value, and the procedure will be shifted to step S7. In this example, the second threshold value is set to 0.6, but is adjusted according to the touch panel employed.

As described above, it is when the value of V(S3) and the value of VYU(X0, Y0) are determined as being close in step S4 and the value of V(S5) and the value of VYD(X0, Y0) are determined as being close in step S6 that the procedure is shifted to step S7. The control module 35 determines in step S7 that such a case is a single touch in which only one point has been touched in the touch detection region. In this case, the position of the X-coordinate of the touched position when only one point has been touched in the touch detection region has been derived as the first reference data X0 in step S1, and the position of the Y-coordinate thereof has been derived as the second reference data Y0 in step S2.

Accordingly, in step S7, the control module 35 outputs a signal indicating that the touch is a single touch and including information relating to coordinate (X0, Y0) as a touched position as a value detected by the touch panel device 2. After that, the control module 35 ends the procedure. The detected value is output to the control device of the electronic device in which the display device 1 is incorporated, for example. The control device that has acquired the detected value determines that only one point has been touched in the touch panel, and is capable of executing a predetermined procedure compliant with a single touch.

When the touch cannot be determined as a single touch after following step S4 and step S6 in sequence, the procedure is shifted to step S8. In such a case, the control module 35 determines that the two points have been simultaneously touched. The control module 35 determines that such a case is a multi-touch in which two points are simultaneously touched in the touch detection region, and starts deriving the distance between the simultaneously touched two points.

In order to derive the distance between the two simultaneously touched points, the control module 35 reads a multi-touch amplitude reference value YU ground table 56 stored in advance in the storage module 37, as shown in FIG. 18.

The multi-touch amplitude reference value YU ground table 56 is formed in advance as follows. That is, the value of coordinate (X2, Y2) is a potential measured by the potential measuring module 33 when the two points of coordinates (X1, Y2) and (X3, Y2) positioned adjacent thereto, as viewed in the X-direction, are simultaneously touched, in the third state shown in FIG. 10. Similarly, the value of coordinates (X2, Y3) is equal to the potential measured by the potential measuring module 33 when the two points of coordinates (X1, Y3) and (X3, Y3) are simultaneously touched. Similarly, the value of coordinates (X2, Y4), for example, is equal to the potential measured by the potential measuring module 33 when the two points of coordinates (X1, Y4) and (X3, Y4) are simultaneously touched.

Hereinafter, the value of coordinates (X, Y) recorded in the multi-touch amplitude reference value YU ground table 56 will be referred to as VrefYU(X, Y). In this case, as described above, the multi-touch amplitude reference value YU ground table 56 represents the value at each coordinate by the potential measured when the two coordinate positions adjacent thereto, as viewed in the X-direction, are touched. However, this is not limited to the case where the two coordinate positions adjacent thereto, as viewed in the X-direction, are touched, but may be applied to a case where the two coordinate positions adjacent thereto, as viewed in the Y-direction, are touched, for example.

VrefYU(X, Y) is a potential when the most adjacent two points to coordinates (X, Y), as viewed in the X- or Y-direction, are simultaneously touched, and is a reference of the potential of a multi-touch having coordinates (X, Y) as the center.

A further description will be provided on step S8. In step S8, the control module 35 drives VrefYU(X0, Y0) based on the first reference data X0 derived in step S1 and the second reference data Y0 derived in step S2 from the read multi-touch amplitude reference value YU ground table 56. The control module 35 obtains the difference between the value of V(S3) acquired in step S3 and the value of VrefYU(X0, Y0). The value of the difference will be referred to as VdifYU(X0, Y0).

In step S9, the control module 35 compares the value of VdifYU(X0, Y0) obtained in step S8 and the predetermined third threshold value. When the value of VdifYU(X0, Y0) is less than the third threshold value, the control module 35 shifts the procedure to step S10. When the value of VdifYU (X0, Y0) is greater than or equal to the third threshold value, the control module 35 shifts the procedure to step S11.

In step S10, the control module 35 sets the value of VdifYU (X0, Y0) to 0, and shifts the procedure to step S11.

The procedure of steps S8-S10 of the case where (X0, Y0)=(X4, Y4) as a result of steps S1 and S2 will be described below with examples.

When (X0, Y0)=(X4, Y4), V(S3) will be the value shown in FIG. 12, according to the two touched positions, as described above. Accordingly, in step S8, by subtracting VrefYU(X4, Y4)=1.5 shown in FIG. 18 from the value of V(S3) shown in FIG. 12 in step S8, the value of VdifYU(X4, Y4) will be the value shown in FIG. 19, according to the positions of the two simultaneously touched positions. Next, assuming that the third threshold value in step S9 is 0.2, when the value of VdifYU(X4, Y4) is less than 0.2, 0 is substituted into VdifYU (X4, Y4) in step S10. VdifYU(X4, Y4) obtained as a result thereof will be the value as shown in FIG. 20, according to the touched position.

As shown in FIG. 20, the value of VdifYU(X4, Y4) increases as the distance from (X4, Y4) increases, with regard to each coordinate in the upper-left direction and the bottom-right direction in the drawing, with reference to (X4, Y4). In this example, the third threshold value is set to 0.2, but is adjusted according to the touch panel employed.

Figure 5:
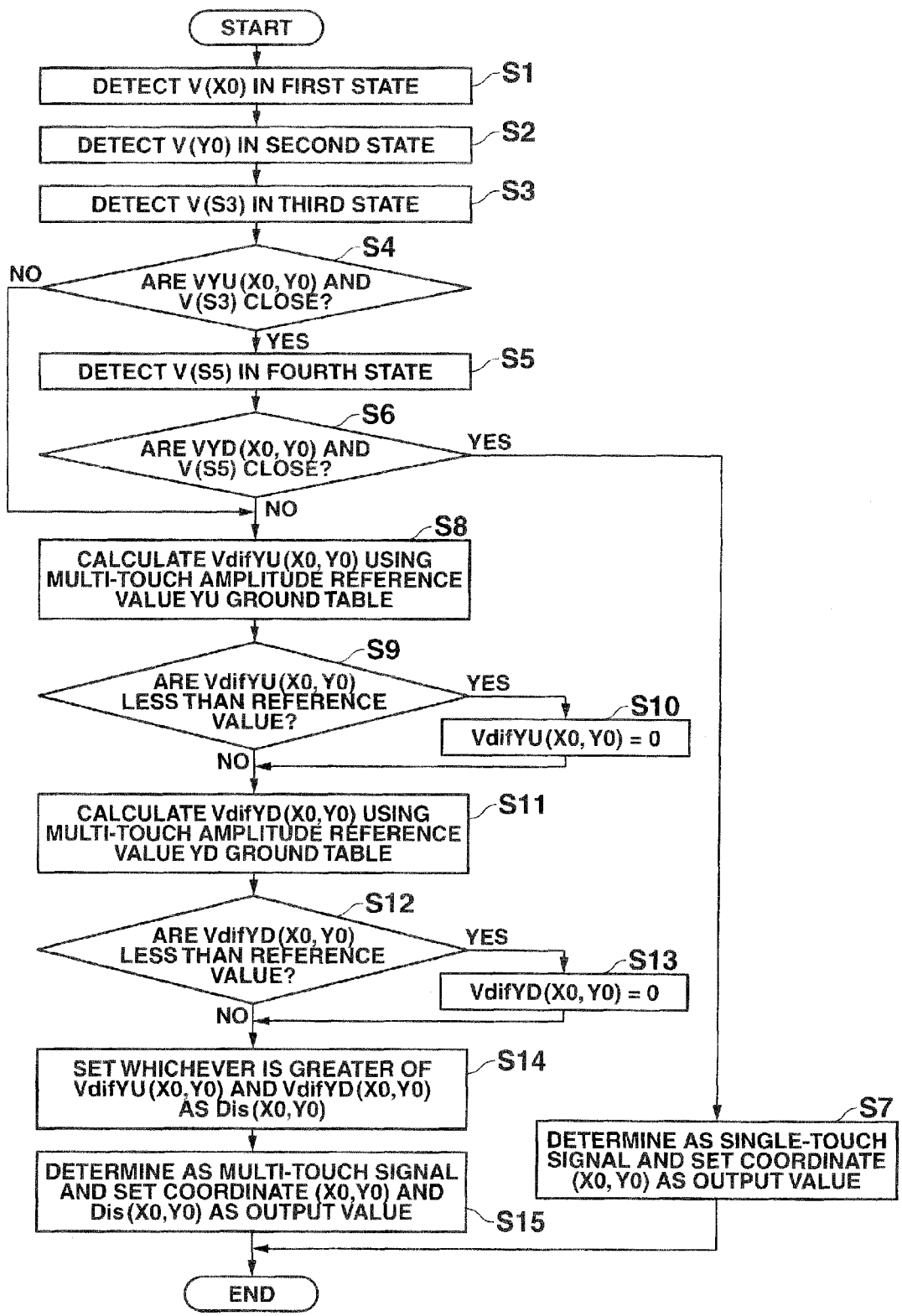
FIG. 5 is a flowchart illustrating a procedure of detecting a touched position on the touch panel device.

Referring back to the flowchart shown in FIG. 5, a description will be further made. In step S11, the control module 35 reads a multi-touch amplitude reference value YD ground table 58 stored in advance in the storage module 37, as shown in FIG. 21.

The multi-touch amplitude reference value YD ground table 58 is formed in advance, as in the case of the above-described multi-touch amplitude reference value YU ground table 56, as follows. The value of coordinate (X2, Y2), for example, is a potential measured by the potential measuring module 33 when the two points of coordinates (X1, Y2) and (X3, Y2) positioned adjacent thereto, as viewed in the X-direction, are simultaneously touched, in the fourth state shown in FIG. 14.

Hereinafter, the value of coordinates (X, Y) recorded in the multi-touch amplitude reference value YD ground table 58 will be referred to as VrefYD(X, Y). In this case, as described above, the multi-touch amplitude reference value YD ground table 58 represents the value at each coordinate by the potential measured when the two coordinate positions adjacent thereto, as viewed in the X-direction, are touched. However, this is not limited to the case where the two coordinate positions adjacent thereto, as viewed in the X-direction, are touched, but may be applied to a case where the two coordinate positions adjacent thereto, as viewed in the Y-direction, are touched, for example.

VrefYD(X, Y) is a potential when the most adjacent two points to coordinates (X, Y), as viewed in the X- or Y-direction, are simultaneously touched, and is a reference of the potential of a multi-touch having coordinates (X, Y) as the center.

In step S11, the control module 35 drives VrefYD(X0, Y0) based on the first reference data X0 derived in step S1 and the second reference data Y0 derived in step S2 from the read multi-touch amplitude reference value YD ground table 58. The control module 35 obtains the difference between the value of V(S5) acquired in step S5 and the value of VrefYD (X0, Y0). The value of the difference will be referred to as VdifYD(X0, Y0).

In step S12, the control module 35 compares the value of VdifYD(X0, Y0) obtained in step S11 and the predetermined fourth threshold value. When the value of VdifYD(X0, Y0) is less than the fourth threshold value, the control module 35 shifts the procedure to step S13. When the value of VdifYD (X0, Y0) is greater than or equal to the fourth threshold value, the control module 35 shifts the procedure to step S14. In step S13, the control module 35 sets the value of VdifYD(X0, Y0) to 0, and shifts the procedure to step S14.

The procedure of steps S11-S13 of the case where (X0, Y0)=(X4, Y4) as a result of steps S1 and S2 will be described below with examples.

When (X0, Y0)=(X4, Y4), V(S5) will be the value shown in FIG. 16, according to the two touched positions, as described above. Accordingly, in step S11, by subtracting VrefYD(X4, Y4)=1.7 shown in FIG. 21 from the value of V(S5) shown in FIG. 16 in step S11, the value of VdifYD(X4, Y4) will be the value shown in FIG. 22, according to the positions of the two simultaneously touched positions. Next, assuming that the fourth threshold value in step S12 is 0.2, when the value of VdifYD(X4, Y4) is less than 0.2, 0 is substituted into VdifYD (X4, Y4) in step S13. VdifYD (X4, Y4) obtained as a result thereof will be the value as shown in FIG. 23.

As shown in FIG. 23, the value of VdifYD(X4. Y4) increases as the distance from (X4, Y4) increases, with regard to each coordinate in the upper-right direction and the bottom-left direction in the drawing, with reference to (X4, Y4). In this example, the fourth threshold value is set to 0.2, but is adjusted according to the touch panel employed.

Figures 24, 25:
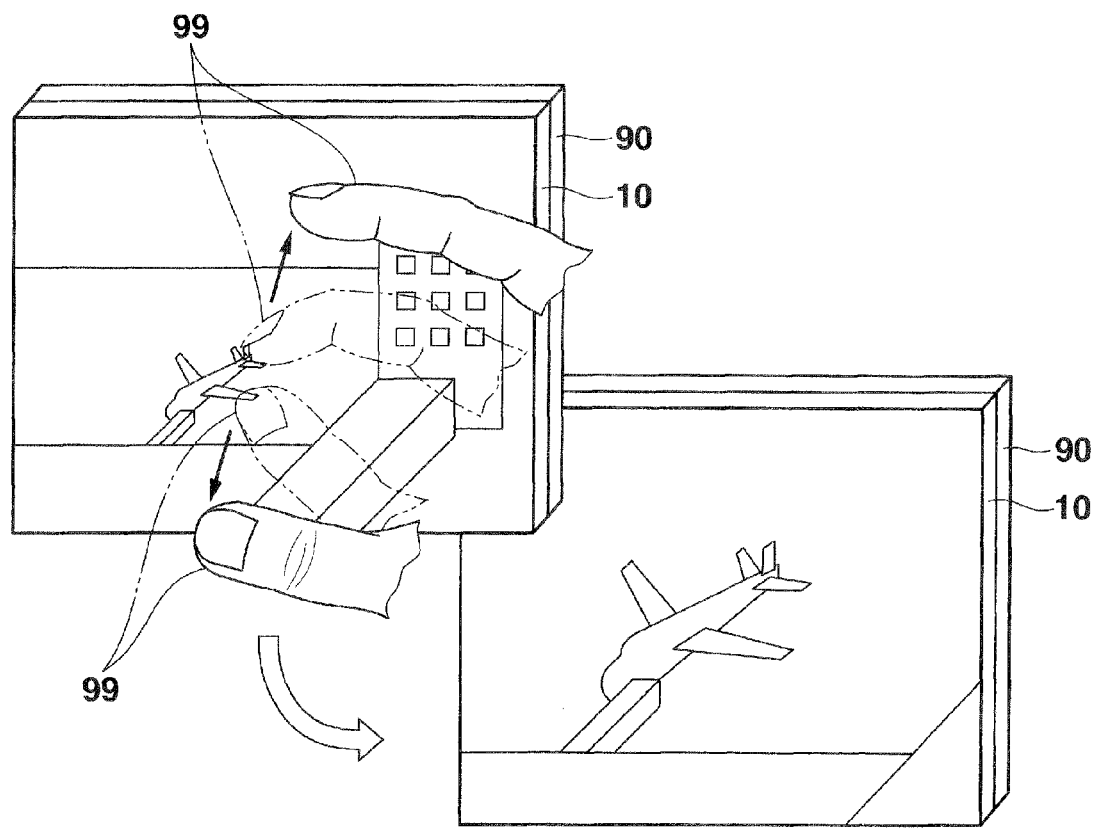
FIG. 24 illustrates a result obtained by comparing the value shown in FIG. 20 and the value shown in FIG. 23.
FIG. 25 illustrates an application example of the resistive touch panel device of the present invention.

Next, in step S14, the control module 35 compares the values of VdifYU(X0, Y0) and VdifYD(X0, Y0), and sets the greater value as Dis(X0, Y0). As in the above-described case, FIG. 24 shows the value of Dis(X4, Y4) obtained when (X0, Y0)=(X4, Y4). In this way, the obtained Dis(X0, Y0) indicates a distance between the two simultaneously touched points. As described above, the position in the midpoint of the two simultaneously touched points is coordinates (X0, Y0), as described above.

As shown in FIG. 24, the distance between two points cannot be detected in the vertical and horizontal direction from the midpoint (X4, Y4) of the two simultaneously touched points. This is because the potential gradient is constant and not deflective along the column of X4 and the row of Y4, as described above. In step S15, the control module 35 outputs a signal indicating that the touch is a multi-touch and including information relating to coordinates (X0, Y0) and Dis(X0, Y0) as a detected value detected by the touch panel device 2. After that, the control module 35 ends the procedure. The detected value is output to the control device of the electronic device in which the display device 1 is incorporated, for example. The control device that has acquired the detected value determines that two points have been touched in the touch panel, and is capable of executing a predetermined procedure compliant with a multi-touch.

As described above, according to the present embodiment, it is possible to detect the position of the midpoint between the two points and the distance between the two points when the two points are simultaneously touched, by means of a resistive-film touch panel that can be manufactured at a low cost due to its simple configuration.

Based on the detected value of the touched position detected by such a touch panel device, an electronic device mounting the touch panel is capable of setting the specifications as will be described below. That is, it is possible to set the specification in which one point in an image displayed in an image display region of the display panel 90 shown in FIG. 1 is specified via the touch panel 10, or the displayed image is scrolled by moving the touched point to an arbitrary direction. In addition to that, as shown in FIG. 25, for example, when the image displayed on the display panel 90 wants to be zoomed in around a specific position as a central position, it is possible to set the specification in which the touch panel 10 is touched with two fingers 99 interposing the central position and the two fingers 99 are moved on the touch panel 10 so as to increase the distance between the two fingers 99. Similarly, when the image wants to be zoomed out, it is possible to set the specification in which the fingers 99 are moved on the touch panel 10 so as to decrease the distance between the fingers 99.

Figure 26:
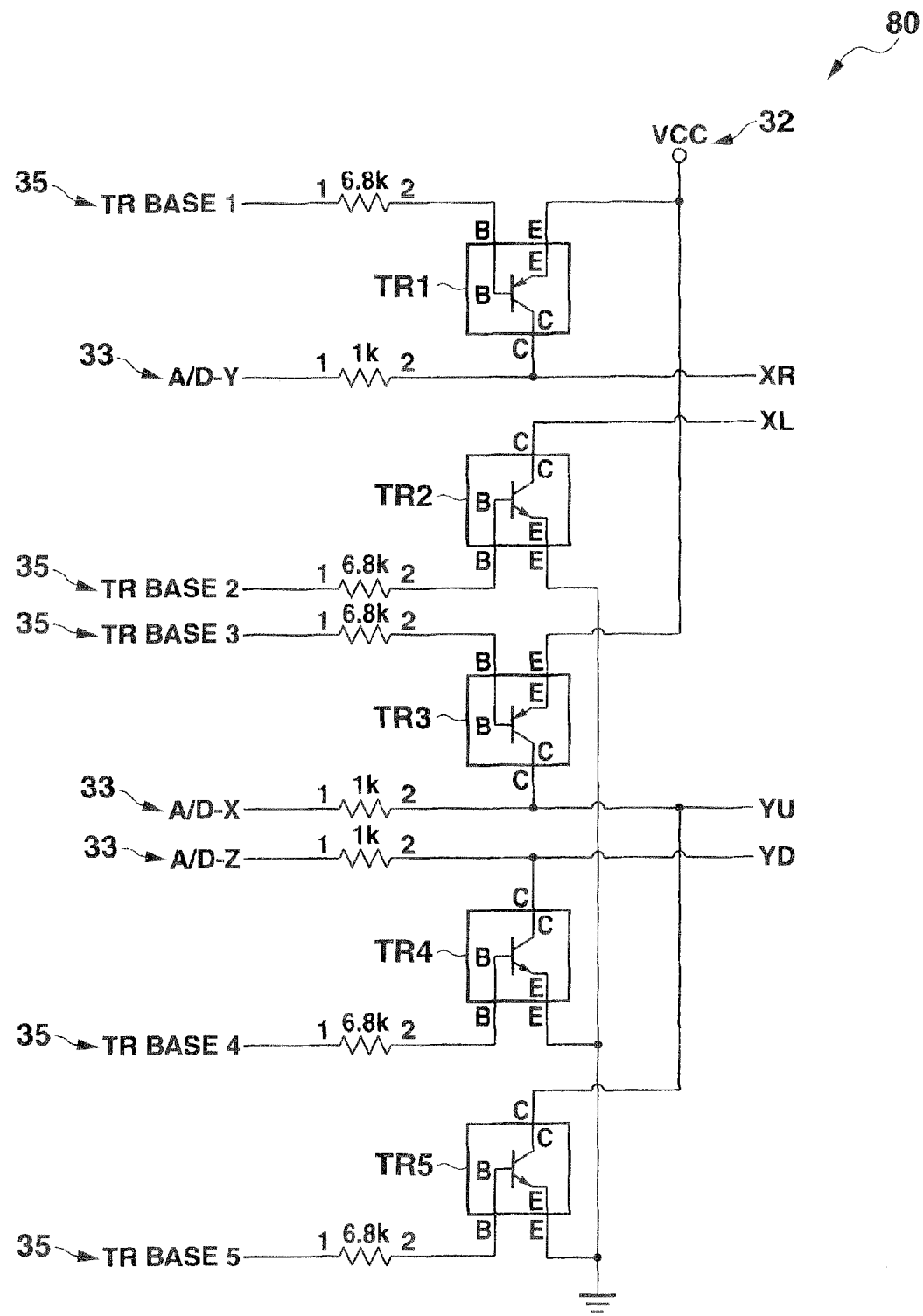
FIG. 26 illustrates an example of a state switching device in a driving circuit.

Switching between the above-described first to fourth states can be embodied by controlling the switching circuit shown in FIG. 26, for example. By connecting the voltage source 32 to the VCC in FIG. 26 and controlling the transistors Tr1-Tr5, the first to fourth states can be easily switched from one to another. The potential can be measured via the corresponding output modules A/D-X, A/D-Y, A/D-Z at that time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

For example, the direction of the voltage applied to between terminals XL and XR and terminals YU and YD may be inverted. Alternatively, the terminal to which a voltage is applied by the voltage source 32 may be set between terminals YU and YD, and the combination of the terminal at which the potential is measured by the potential measuring module 33 and the terminal grounded may be set to terminal XL and terminal XR, respectively. In that case, the procedure can be varied according to the variation in terminal and the table stored in the storage module 37 can be varied.

What is claimed is:

1. A method of detecting a contact state of resistive touch panel device, the method comprising:
measuring, in a first state in which (i) a predetermined voltage is applied between a first end region and a second end region and (ii) a third end region is made open, a potential at a fourth end region as a first potential, the first end region being an end region of a first resistive film, as viewed in a first direction, the second end region being an end region of the first resistive film opposite to the first end region, the third end region being an end region of a second resistive film, as viewed in a second direction which intersects the first direction, and the fourth end region being an end region of the second resistive film opposite to the third end region;
measuring, in a second state in which (i) the voltage is applied between the third end region and the fourth end region and (ii) the first end region is made open, a potential at the second end region as a second potential;
measuring, in a third state in which (i) the first end region and the fourth end region are short-circuited and (ii) the voltage is applied between the first end region and the second end region, a potential at the third end region as a third potential;
measuring, in a fourth state in which (i) the first end region and the third end region are short-circuited and (ii) the voltage is applied between the first end region and the second end region, a potential at the fourth end region as a fourth potential; and
deriving distance information between two points when the first resistive film contacts the second resistive film at the two points, based on the first potential, the second potential, the third potential and the fourth potential.

2. The method according to claim 1, wherein deriving the distance information between the two points is based on a lookup-table stored in advance.

3. The method according to claim 2, wherein the lookup-table includes:
a first lookup-table including a value obtained by measuring in advance a potential at the third end region in the third state when the first resistive film and the second resistive film contact each other at one point;
a second lookup-table including a value obtained by measuring in advance a potential at the fourth end region in the fourth state when the first resistive film and the second resistive film contact each other at one point;
a third lookup-table including a value obtained by measuring in advance a potential at the third and region in the third state when the first resistive film and the second resistive film contact each other at two points, the two points being apart from each other by a predetermined distance in one of the first direction and the second direction; and
a fourth lookup-table including a value obtained by measuring in advance a potential at the fourth end region in the fourth state when the first resistive film and the second resistive film contact each other at two points, the two points being apart from each other by a predetermined distance in one of the first direction and the second direction.

4. The method according to claim 3, wherein the lookup-table further includes:
a fifth lookup-table including a value obtained by measuring in advance a potential at the fourth end region in the first state when the first resistive film and the second resistive film contact each other at one point; and
a sixth lookup-table including a value obtained by measuring in advance a potential at the second end region in the second state when the first resistive film and the second resistive film contact each other at one point.

5. The method according to claim 4, further comprising:
deriving position information of a midpoint between the two points based on the fifth lookup-table and the sixth lookup-table, after measuring the first potential and the second potential.

6. The method according to claim 1, wherein the first direction and the second direction are perpendicular to each other.

7. The method according to claim 1, wherein the first resistive film and the second resistive film are arranged so as to face each other.

8. The method according to claim 1, further comprising:
deriving position information of a midpoint between the two points based on the first potential and the second potential, after measuring the first potential and the second potential.

9. The method according to claim 1, wherein deriving the distance information between the two points is carried out when a number of contact points between the first resistive film and the second resistive film is determined to be not one.

10. A resistive touch panel device comprising:
a touch panel including
(i) a first resistive film, and
(ii) a second resistive film which faces the first resistive film; and
a driving circuit configured to perform
(i) measuring, in a first state in which (a) a predetermined voltage is applied between a first end region and a second end region and (b) a third end region is made open, a potential at a fourth end region as a first potential, the first end region being an end region of a first resistive film, as viewed in a first direction, the second end region being an end region of the first resistive film opposite to the first end region, the third end region being an end region of a second resistive film, as viewed in a second direction which intersects the first direction, and the fourth end region being an end region of the second resistive film opposite to the third end region;
(ii) measuring, in a second state in which (a) the voltage is applied between the third end region and the fourth end region and (b) the first end region is made open, a potential at the second end region as a second potential;
(iii) measuring, in a third state in which (a) the first end region and the fourth end region are short-circuited and (b) the voltage is applied between the first end region and the second end region, a potential at the third end region as a third potential;
(iv) measuring, in a fourth state in which (a) the first end region and the third end region are short-circuited and (b) the voltage is applied between the first end region and the second end region, a potential at the fourth end region as a fourth potential; and
(v) deriving distance information between two points when the first resistive film contacts the second resistive film at the two points, based on the first potential, the second potential, the third potential and the fourth potential.

11. The resistive touch panel device according to claim 1, wherein the driving circuit derives the distance information between the two points by referring to a lookup-table stored in advance.

12. The resistive touch panel device according to claim 11, wherein the lookup-table includes:
a first lookup-table including a value obtained by measuring in advance a potential at the third end region in the third state when the first resistive film and the second resistive film contact each other at one point;
a second lookup-table including a value obtained by measuring in advance a potential at the fourth end region in the fourth state when the first resistive film and the second resistive film contact each other at one point;
a third lookup-table including a value obtained by measuring in advance a potential at the third end region in the third state when the first resistive film and the second resistive film contact each other at two points, the two points being apart from each other by a predetermined distance in one of the first direction and the second direction; and a fourth lookup-table including a value obtained by measuring in advance a potential at the fourth end region in the fourth state when the first resistive film and the second resistive film contact each other at two points, the two points being apart from each other by a predetermined distance in one of the first direction and the second direction.

13. The resistive touch panel device according to claim 12, wherein the lookup-table further includes:
a fifth lookup-table including a value obtained by measuring in advance a potential at the fourth end region in the first state when the first resistive film and the second resistive film contact each other at one point; and
a sixth lookup-table including a value obtained by measuring in advance a potential at the second end region in the second state when the first resistive film and the second resistive film contact each other at one point.

14. The resistive touch panel device according to claim 13, wherein the driving circuit derives position information of a midpoint between the two points based on the fifth lookup-table and the sixth lookup-table.

15. The resistive touch panel device according to claim 10, wherein the first direction and the second direction are perpendicular to each other.

16. The resistive touch panel device according to claim 10, wherein the driving circuit derives position information of a midpoint between the two points based on the first potential and the second potential.

17. The resistive touch panel device according to claim 10, wherein the touch panel further includes:
a first substrate, the first resistive film being formed on the first substrate; and
a plurality of projections arranged so as to be interposed between the first substrate and the first resistive film.

18. A display device comprising:
a display panel which displays an image;
a touch panel including
(i) a first resistive film, and
(ii) a second resistive film which faces the first resistive film; and
a driving circuit configured to perform
(i) measuring, in a first state in which (a) a predetermined voltage is applied between a first end region and a second end region and (b) a third end region is made open, a potential at a fourth end region as a first potential, the first end region being an end region of a first resistive film, as viewed in a first direction, the second end region being an end region of the first resistive film opposite to the first end region, the third end region being an end region of a second resistive film, as viewed in a second direction which intersects the first direction, and the fourth end region being an end region of the second resistive film opposite to the third end region;
(ii) measuring, in a second state in which (a) the voltage is applied between the third end region and the fourth end region and (b) the first end region is made open, a potential at the second end region as a second potential;
(iii) measuring, in a third state in which (a) the first end region and the fourth end region are short-circuited and (b) the voltage is applied between the first end region and the second end region, a potential at the third end region as a third potential;
(iv) measuring, in a fourth state in which (a) the first end region and the third end region are short-circuited and (b) the voltage is applied between the first end region and the second end region, a potential at the fourth end region as a fourth potential; and (v) deriving distance information between two points when the first resistive film contacts the second resistive film at the two points, based on the first potential, the second potential, the third potential and the fourth potential.

19. The display device according to claim 18, wherein the driving circuit derives the distance information between the two points by referring to a lookup-table stored in advance.

20. The display device according to claim 18, wherein the display panel is arranged such that an image display region of the display panel faces a touch detection region of the touch panel.

* * * * *

UNITED STATES PATENT AND TRADEMARK OFFICE
CERTIFICATE OF CORRECTION

| | | |
|---|---|---|
| PATENT NO. | : 8,564,561 B2 | Page 1 of 1 |
| APPLICATION NO. | : 13/029247 | |
| DATED | : October 22, 2013 | |
| INVENTOR(S) | : Sakamoto | |

It is certified that error appears in the above-identified patent and that said Letters Patent is hereby corrected as shown below:

On the Title page; Item [57] Abstract, line 7:
    change "at fourth" to --at first--.

In the Claims; Column 18, line 34, Claim 3, line 12:
    delete "and" and insert --end--.

Signed and Sealed this
Twenty-sixth Day of August, 2014

Michelle K. Lee
*Deputy Director of the United States Patent and Trademark Office*